(12) United States Patent
Kazama

(10) Patent No.: US 8,354,685 B2
(45) Date of Patent: Jan. 15, 2013

(54) SEMICONDUCTOR LIGHT EMITTING DEVICE

(75) Inventor: Takuya Kazama, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 167 days.

(21) Appl. No.: 13/026,633

(22) Filed: Feb. 14, 2011

(65) Prior Publication Data

US 2011/0198647 A1 Aug. 18, 2011

(30) Foreign Application Priority Data

Feb. 18, 2010 (JP) ................................. 2010-033940

(51) Int. Cl.
*H01L 33/00* (2010.01)
(52) U.S. Cl. ................................. 257/98; 257/E33.072
(58) Field of Classification Search ................ 257/98, 257/E33.072
See application file for complete search history.

(56) References Cited

U.S. PATENT DOCUMENTS

2010/0123148 A1* 5/2010 Park ............................. 257/94

FOREIGN PATENT DOCUMENTS

| JP | 2002-217450 A | 8/2002 |
|---|---|---|
| JP | 2003-258296 A | 9/2003 |
| JP | 2008-103627 A | 5/2008 |
| JP | 4230219 B2 | 12/2008 |

* cited by examiner

*Primary Examiner* — Marc Armand
*Assistant Examiner* — Eva Yan Montalvo
(74) *Attorney, Agent, or Firm* — Holtz, Holtz, Goodman & Chick, PC

(57) ABSTRACT

A semiconductor light emitting device which can suppress the self-absorption of light propagating in a semiconductor film without hindering current spread therein. A reflecting film provided between a support substrate and the semiconductor film of the device includes reflecting electrodes that are in ohmic contact with the semiconductor film and that form current paths between the reflecting electrodes and surface electrodes in the semiconductor film. The reflecting electrodes are in contact with the semiconductor film at such positions that the surface electrodes, provided on the light-extraction-surface-side surface of the semiconductor film, are not over the reflecting electrodes along a direction of the thickness of the semiconductor film. The semiconductor film has reflecting-surface-side recesses made in regions containing regions directly under the surface electrodes and recessed toward the light-extraction-surface side, and reflecting-surface-side protrusions provided in regions containing parts of the semiconductor film in contact with the reflecting electrodes and bonded to the support substrate via the reflecting film.

13 Claims, 13 Drawing Sheets

SEMICONDUCTOR LIGHT EMITTING DEVICE

BACKGROUND OF THE INVENTION

1. Field of the Invention

The present invention relates to a semiconductor light emitting device such as an LED (light emitting diode) and particularly to a technique for improving light extraction efficiency.

2. Description of the Related Art

For LEDs formed of AlGaInP-based material, the band gap of the light emitting layer is larger than the band gap of a GaAs substrate used in crystal-growth. Hence, part of light directed toward the light-extraction-surface side out of the light emitted from the light emitting layer can be extracted, while light directed to the GaAs-substrate side is then absorbed by the GaAs substrate.

Japanese Patent Kokai No. 2002-217450 (Patent Literature 1) discloses an LED which is produced by forming a semiconductor film made of AlGaInP-based material on a GaAs substrate, then sticking the semiconductor film to a support substrate via a reflecting film made of metal having high reflectance, and then removing the GaAs growth substrate. With the LED of this configuration, light directed toward the opposite side from the light extraction surface is reflected by the reflecting film, not absorbed by the GaAs substrate, thus improving the light extraction efficiency of the LED.

However, light incident at an angle greater than or equal to the critical angle on the interface between the semiconductor film and an ambient medium such as air or resin is totally reflected and cannot be extracted to the outside. Light which could not be extracted outside is repeatedly reflected inside the semiconductor film (multiple reflection). The intensity of light propagating inside the semiconductor film decreases exponentially with propagation distance (optical path length). That is, light being multi-reflected inside the semiconductor film is absorbed by the semiconductor film (self-absorption) and is difficult to be extracted outside. For example, if an AlGaInP-based semiconductor film having a refractive index of 3.3 is enclosed in resin having a refractive index of 1.5, then the critical angle is 27° with the reflectance at the interface between the semiconductor film and the resin being about 15%, and thus the proportion of light which can be extracted outside is limited to about 4.5%.

Japanese Patent Kokai No. 2008-103627 (Patent Literature 2) discloses a semiconductor light emitting device having recesses/protrusions formed in the light extraction surface of the semiconductor film. With this configuration, light directed to the light extraction surface is then scattered and diffracted by the recesses/protrusions, thereby reducing the amount of light totally reflected at the interface between the light extraction surface and the ambient medium, and thus the light extraction efficiency can be improved. Further, Patent Literature 2 describes that the recesses/protrusions are formed without making the thickness of the semiconductor film smaller. This is because the smaller thickness of the semiconductor film results in larger series resistance and also insufficient spread of current. That is, insufficient current spread in the semiconductor film results in the occurrence of a region having high current density. When the current density in the semiconductor film exceeds a certain level, an overflow of carriers injected into the light emitting layer occurs, resulting in a decrease in the quantity of carriers that can contribute to light emission, thus reducing luminous efficiency. Thus, current needs to be made to widely spread across in the semiconductor film by securing the thickness of the semiconductor film to a certain degree. Like techniques are disclosed in Japanese Patent No. 4230219 (Patent Literature 3) and Japanese Patent Kokai No. 2003-258296 (Patent Literature 4).

SUMMARY OF THE INVENTION

Although light is more likely to be extracted outside by forming the recesses/protrusions on the light-extraction-surface side, light multi-reflected inside the semiconductor film still exists. As mentioned above, in order to promote current spread in the semiconductor film, the thickness of the semiconductor film needs to be secured, but the greater the thickness of the semiconductor film is, the longer the propagation distance (optical path length) of light multi-reflected inside the semiconductor film is, which means that self-absorption is more likely to occur, thus reducing the light extraction efficiency. That is, it is difficult to suppress the self-absorption of light propagating inside the semiconductor film without hindering current spread inside the semiconductor film.

The present invention has been made in view of the above points, and an object thereof is to provide a semiconductor light emitting device which can suppress the self-absorption of light propagating inside the semiconductor film without hindering current spread inside the semiconductor film.

According to the present invention, there is provided a semiconductor light emitting device which comprises a support substrate; a semiconductor film including a light emitting layer provided on the support substrate; surface electrodes provided on a surface on the light-extraction-surface side of the semiconductor film; and a reflecting film forming a reflecting surface and provided between the support substrate and the semiconductor film. The reflecting film includes reflecting electrodes that are in ohmic contact with the semiconductor film and that form current paths between the reflecting electrodes and the surface electrodes in the semiconductor film. The reflecting electrodes are in contact with the semiconductor film at such positions that the surface electrodes are not over the reflecting electrodes along a direction of the thickness of the semiconductor film. The semiconductor film has, at least at the surface on the side facing the reflecting surface, reflecting-surface-side recesses made in regions containing regions directly under the surface electrodes and recessed toward the light-extraction-surface side, and reflecting-surface-side protrusions provided in regions containing parts of the semiconductor film in contact with the reflecting electrodes and bonded to the support substrate via the reflecting film. The reflecting film covers surfaces of the reflecting-surface-side recesses and the reflecting-surface-side protrusions.

According to the semiconductor light emitting device of the present invention, the self-absorption of light propagating in the semiconductor film can be suppressed without hindering current spread therein, thus improving the light extraction efficiency.

DETAILED DESCRIPTION OF THE INVENTION

Figure 1:
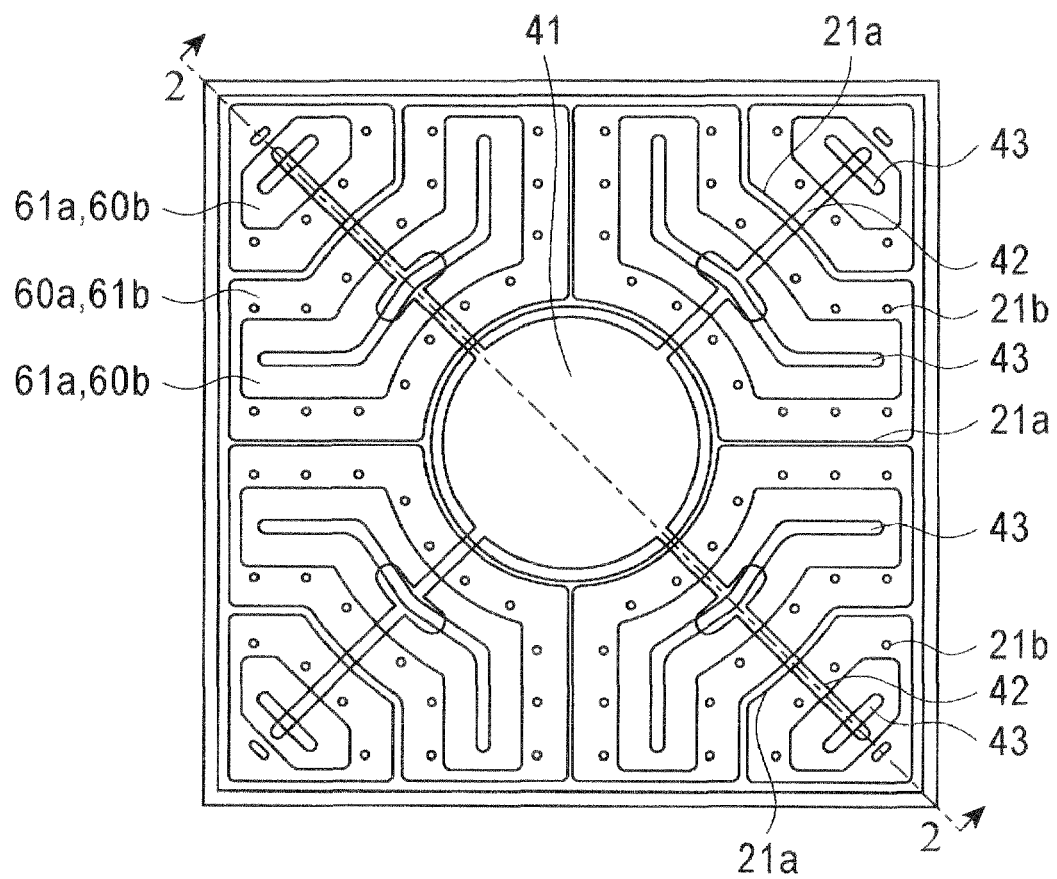
FIG. 1 is a plan view showing the configuration of a semiconductor light emitting device according to an embodiment of the present invention.

Embodiments of the present invention will be described with reference to the accompanying drawings. In the figures cited below, the same reference numerals are used to denote substantially the same or equivalent constituents or parts.

Figure 2:
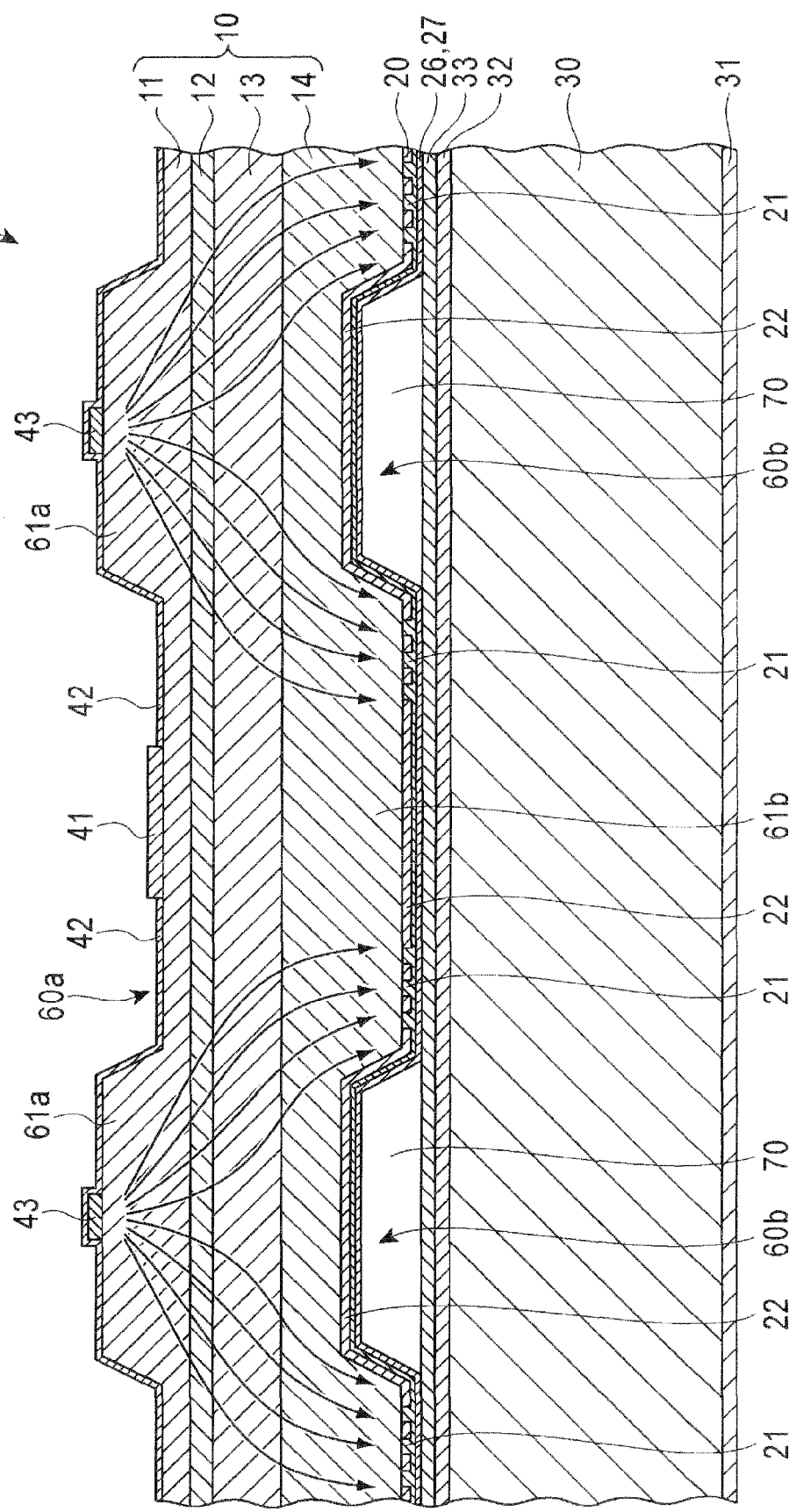
FIG. 2 is a cross-sectional view taken along line 2-2 in FIG. 1.

FIG. 1 is a plan view showing the configuration of a semiconductor light emitting device 1 according to an embodiment of the present invention, and FIG. 2 is a cross-sectional view taken along line 2-2 in FIG. 1.

The semiconductor light emitting device 1 has a so-called stuck-together structure where a semiconductor film 10 and a support substrate 30 are joined via a reflecting film 20. The semiconductor film 10 is configured with an n-type clad layer 11, a light emitting layer 12, a p-type clad layer 13, and a p-type contact layer 14 that are laid one over another in that order from the light-extraction-surface side. The total thickness of the semiconductor film 10 is, for example, 6 μm, and the outline of the principal surface is, for example, a square with one side measuring 300 μm. The n-type clad layer 11 is made of, e.g., $(Al_{0.7}Ga_{0.3})_{0.5}In_{0.5}P$, having a layer thickness of 3 μm. The light emitting layer 12 has, e.g., a multi-quantum well structure and is configured with well layers of about 20 nm thickness made of $(Al_{0.1}Ga_{0.9})_{0.5}In_{0.5}P$ and barrier layers of about 10 nm thickness made of $(Al_{0.56}Ga_{0.44})_{0.5}In_{0.5}P$ that are alternately laid one over the other 15 times. The p-type clad layer 13 is made of, e.g., $(Al_{0.7}Ga_{0.3})_{0.5}In_{0.5}P$, having a layer thickness of 1 μm. The p-type contact layer 14 is made of, e.g., $Ga_{0.9}In_{0.1}P$, having a layer thickness of 1.5 μm. Note that the semiconductor film 10 is not limited in material to AlGaInP-based material, but that another material can be used.

The semiconductor film 10 has recesses 60a, 60b and protrusions 61a, 61b that are formed by partially removing both surface areas on the light-extraction-surface side and the reflecting-surface side opposite thereto, forming a so-called terrace structure. The recess 60a on the light-extraction-surface side is recessed toward the reflecting-surface side with its bottom being flat. The recess 60b on the reflecting-surface side is recessed toward the light-extraction-surface side with its bottom being flat. Both recesses 60a and 60b are formed without reaching the light emitting layer 12.

The reflecting film 20 is provided so as to cover the surface of the p-type contact layer 14 in which the recesses 60b and the protrusions 61b are formed. The reflecting film 20 is constituted by, e.g., a dielectric film 22 made of $SiO_2$ or the like and reflecting electrodes 21 made of AuZn or the like. The reflecting electrodes 21 are in contact with the semiconductor film 10 at the openings of the dielectric film 22 to form ohmic contact with the p-type contact layer 14. The reflecting film 20 comprising the dielectric film 22 and the reflecting electrodes 21 forms a reflecting surface to reflect light emitted from the light emitting layer 12 toward the light-extraction-surface side at least at the interface with the semiconductor film 10. The dielectric film 22 separates the reflecting electrode 21 into line-like line electrode 21a and island-like dot electrodes 21b in the neighborhood of the interface with the p-type contact layer 14. The line electrodes 21a and dot electrodes 21b are joined under the dielectric film 22 to be electrically connected. By configuring the reflecting electrode 21 with the line electrode 21a and dot electrodes 21b in this way, current constriction can be prevented so as to make the current density uniform in the semiconductor film 10. The reflecting electrode 21 is formed such that the line electrode 21a and dot electrodes 21b forming ohmic contact with the semiconductor film 10 are located on the surface of a protrusion 61b on the reflecting-surface side. No line electrode 21a and dot electrode 21b are formed on the recesses 60b on the reflecting-surface side. Further, the line electrode 21a and dot electrodes 21b are provided at such positions that an ohmic electrode 43 on the light-extraction-surface side is not over them along a direction of the semiconductor film thickness. That is, the reflecting electrode 21 is in contact with the semiconductor film 10 at such a position that the surface electrode (ohmic electrode 43) is not over it along a direction of the semiconductor film 10 thickness, forming a so-called counter electrode. Note that instead of $SiO_2$, another transparent dielectric material such as $Si_3N_4$ or $Al_2O_3$ can be used for the dielectric film 22, and that not being limited to AuZn, another material having high light reflectivity which can form ohmic contact with the p-type contact layer 14 is preferably used for the reflecting electrodes 21.

In the present embodiment, with the reflecting electrodes 21 being made of AuZn and the dielectric film 22 being made of $SiO_2$ (with a covering rate of about 85%), the reflectance on the reflecting-surface side is about 94%. Higher reflectance on the reflecting-surface side is more preferable, and where a light extraction structure is provided on the light-extraction-surface side, it is preferable to make regular reflectance high. Where a light extraction structure is not provided, it is preferable to make diffuse reflectance high.

A barrier metal layer 26 and an adhesive layer 27 are provided on the reflecting film 20. The barrier metal layer 26 can be constituted by a single layer or two or more layers including high melting-point metal such as Ta, Ti, or W, or a nitride thereof. The barrier metal layer 26 prevents Zn included in the reflecting electrodes 21 from diffusing outside and prevents eutectic binding material (e.g., AuSn) included in the junction layer 33 from diffusing into the reflecting electrodes 21. The adhesive layer 27 is constituted by a laminated film of, e.g., Ni and Au and has a function to improve wettability to the eutectic binding material included in the junction layer 33. Thereby, the support substrate 30 and the semiconductor film 10 are bonded well.

A Schottky electrode 41 and the ohmic electrodes 43 constituting surface electrodes are formed on the surface of the n-type clad layer 11 that is the light extraction surface. The Schottky electrode 41 constitutes a bonding pad and can be made of material which can form Schottky contact with the n-type clad layer 11 such as Ta, Ti, W, or an alloy thereof. Alternatively, it can be made of an insulating dielectric such as $SiO_2$ instead of metal material. An Au layer may be formed on the outermost surface of the Schottky electrode 41 to improve the wire-bonding-ability and conductivity thereof. The Schottky electrode 41 is formed on the surface (bottom of the recess 60a) of an area in which is formed a recess 60a on the light-extraction-surface side of the semiconductor film 10 having the terrace structure. The ohmic electrodes 43 are made of material which can form ohmic contact with the n-type clad layer 11 such as AuGeNi, AuSn, or AuSnNi and are formed on the surface of the protrusions 61a on the light-extraction-surface side of the semiconductor film 10. The Schottky electrode 41 and the ohmic electrodes 43 are electrically connected through connection lines 42 joining both electrodes. The connection lines 42 are made of the same material as the Schottky electrode 41 and form Schottky contact with the n-type clad layer 11. Because the Schottky electrode 41 forms Schottky contact with the n-type clad layer 11, current does not flow through part of the semiconductor film 10 directly under the Schottky electrode 41. Further, the reflecting electrode 21 on the reflecting-surface side and the ohmic electrode 43 on the light-extraction-surface side are formed at such positions that one is not over the other along a direction of the semiconductor film 10 thickness. The recesses 60a on the light-extraction-surface side are formed over the reflecting electrodes 21, and hollows forming the recesses 60b on the reflecting-surface side are formed directly under the ohmic electrodes 43. That is, current flows between the ohmic electrode 43 on the light-extraction-surface side and the reflecting electrode 21 on the reflecting-surface side. In FIG. 2, paths of current flowing through the semiconductor film 10 are indicated by arrows.

The support substrate 30 is a Si substrate given conductivity by doping with, e.g., a p-type impurity at a high concentration. Ohmic metal layers 31 and 32 of, e.g., Pt are formed on opposite surfaces of the support substrate 30, which is bonded to the reflecting film 20 via the junction layer 33. The junction layer 33 has a laminated structure where, e.g., Ti, Ni, and AuSn are formed in that order from the side close to the support substrate 30. Note that instead of Si, another conductive material such as Ge, Al, or Cu can be used for the support substrate 30.

In FIG. 1, the Schottky electrode 41 and the ohmic electrodes 43 constituting surface electrodes on the light-extraction-surface side are shown on the same plane as the line electrodes 21a and dot electrodes 21b forming the reflecting electrodes 21 on the reflecting-surface side. Line electrodes 21a and dot electrodes 21b on the reflecting-surface side are located on opposite sides of, and along, each of eight electrode pieces constituting the ohmic electrodes 43 on the light-extraction-surface side. In other words, the line electrodes 21a on the reflecting-surface side are formed to surround the electrode pieces constituting the ohmic electrodes 43 on the light-extraction-surface side, with each of the electrode pieces being placed in the middle of an area enclosed by line electrodes 21a on the reflecting-surface side. The ohmic electrode 43 on the light-extraction-surface side and the line electrode 21a and dot electrodes 21b on the reflecting-surface side are placed such that one is not over the other along a direction of the semiconductor film 10 thickness, forming so-called counter electrodes. Because of configuration with counter electrodes, current can be widely spread in the semiconductor film 10 even with the area of the ohmic electrodes 43 on the light-extraction-surface side being smaller. Thus, the covering rate of the electrodes in the light extraction surface can be reduced, thereby improving the light extraction efficiency. Further, with the configuration with counter electrodes, the recesses 60a on the light-extraction-surface side and the recesses 60b on the reflecting-surface side can be enlarged in area because of a relationship with current paths described later.

Figure 3A:
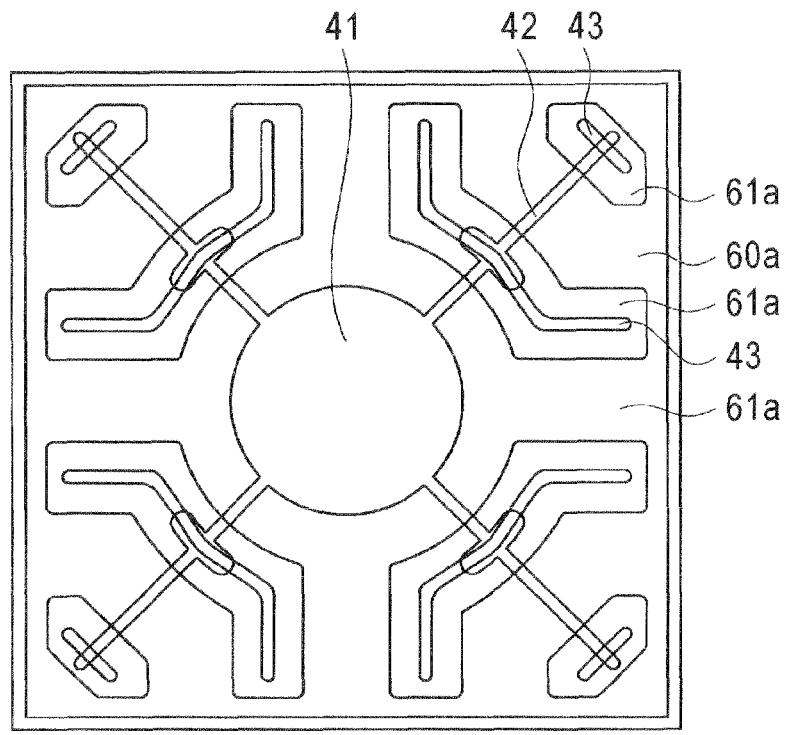
FIG. 3A is a plan view showing the configuration of a terrace structure and surface electrodes on the light-extraction-surface side.
Figure 3B:
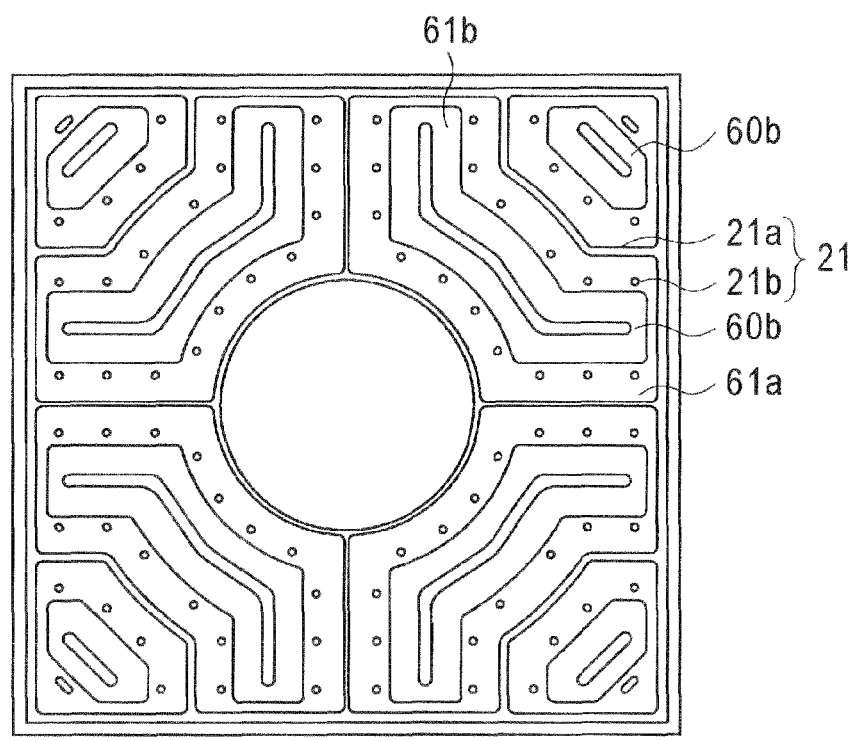
FIG. 3B is a plan view showing the configuration of a terrace structure and reflecting electrodes on the reflecting-surface side.

FIG. 3A shows the configuration of the recesses 60a, protrusions 61a, ohmic electrodes 43, Schottky electrode 41, and connection lines 42 formed on the surface on the light-extraction-surface side of the semiconductor film 10. FIG. 3B shows the configuration of the recesses 60b, protrusions 61b, and reflecting electrodes 21 formed on the surface on the reflecting-surface side of the semiconductor film 10. In the present embodiment, the outlines of the recess 60a on the light-extraction-surface side and the protrusion 61b on the reflecting-surface side are of the same shape, and these outlines are located one over the other along a direction of the semiconductor film 10 thickness. Likewise, the outlines of the protrusion 61a on the light-extraction-surface side and the recess 60b on the reflecting-surface side are of the same shape, and these outlines are located one over the other along a direction of the semiconductor film 10 thickness.

(Relationship Between the Terrace Structure and Current Paths)

As described above, the semiconductor film 10 has the recesses 60a, 60b and the protrusions 61a, 61b formed by partially removing both surface areas on the light-extraction-surface side and on the reflecting-surface side opposite thereto. That is, spaces left after the semiconductor film 10 has been partially removed correspond to the recesses 60a, 60b, and other parts than have been removed correspond to the protrusions 61a, 61b.

Figure 4A:
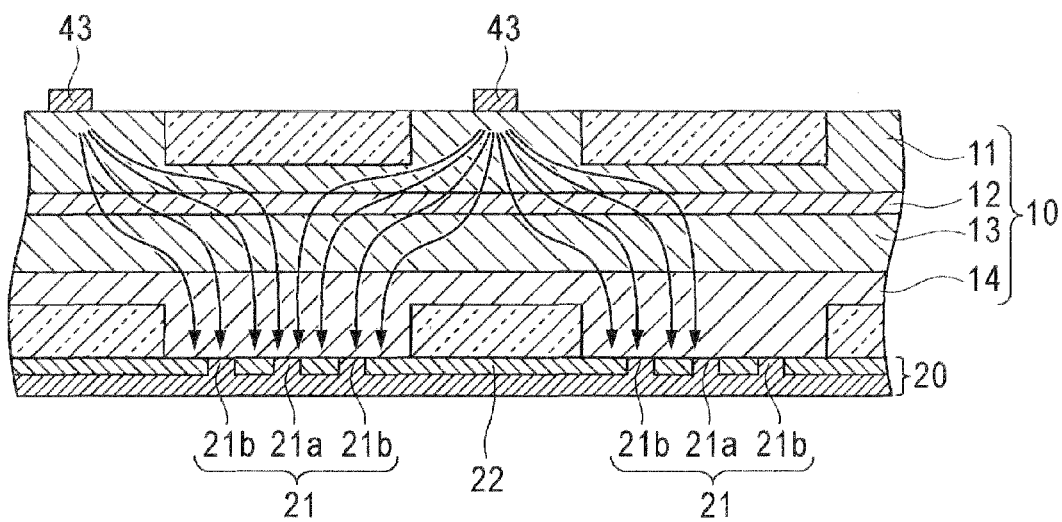
FIG. 4A is a cross-sectional view showing current paths when counter electrodes are formed.
Figure 4B:
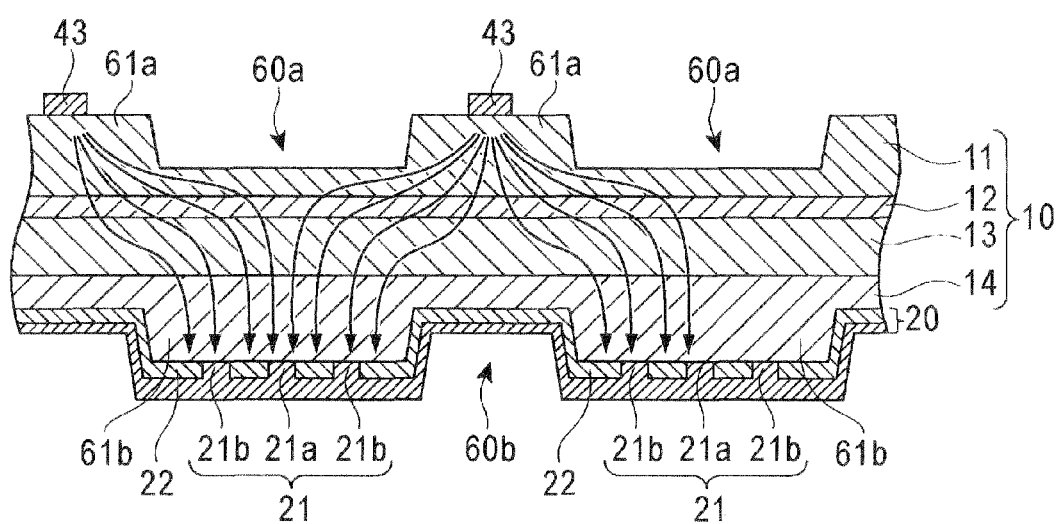
FIG. 4B is a cross-sectional view showing the terrace structure that is the embodiment of the present invention, and current paths.

Two reflecting electrodes 21 each comprising the line electrode 21a and dot electrodes 21b are placed on opposite sides of the ohmic electrode 43 on the light-extraction-surface side, and current flows, spreading left and right, from the ohmic electrode 43 on the light-extraction-surface side to the reflecting electrodes 21 in the semiconductor film 10 as shown in FIG. 4A. Because of the configuration with these counter electrodes, regions left out of the current paths, that is, regions not contributing to current spread (indicated by hatching in FIG. 4A) occur in both surface areas on the light-extraction-surface side and on the reflecting-surface side of the semiconductor film 10. Note that in FIG. 4A the semiconductor film 10 having no terrace structure is shown for the sake of description. As shown in FIG. 4B, in the semiconductor light emitting device 1 according to the present embodiment, by removing parts not contributing to the current spread in the semiconductor film 10 shown in FIG. 4A, the recesses 60a on the light-extraction-surface side and the recesses 60b on the reflecting-surface side are formed. That is, the recesses 60a, 60b are provided at such positions that they do not cross the current paths formed between the ohmic electrode 43 on the light-extraction-surface side and the reflecting electrodes 21.

At areas where part of the semiconductor film 10 is removed, the distance (optical path length) between the reflecting surface and the light extraction surface is shorter. Thus, the self-absorption of light being multi-reflected in the semiconductor film 10 can be suppressed, thereby improving the light extraction efficiency. Because the regions where material of the semiconductor film 10 is removed are out of the current paths, the current spread in the semiconductor film 10 is not hindered. As such, the semiconductor film 10 is partially made thinner by removing parts not contributing to the current spread in the semiconductor film 10, and thereby the self-absorption of light propagating in the semiconductor film 10 can be suppressed without hindering the current spread.
(Configuration of the Terrace Structure on the Light-Extraction-Surface Side)

Figure 5:
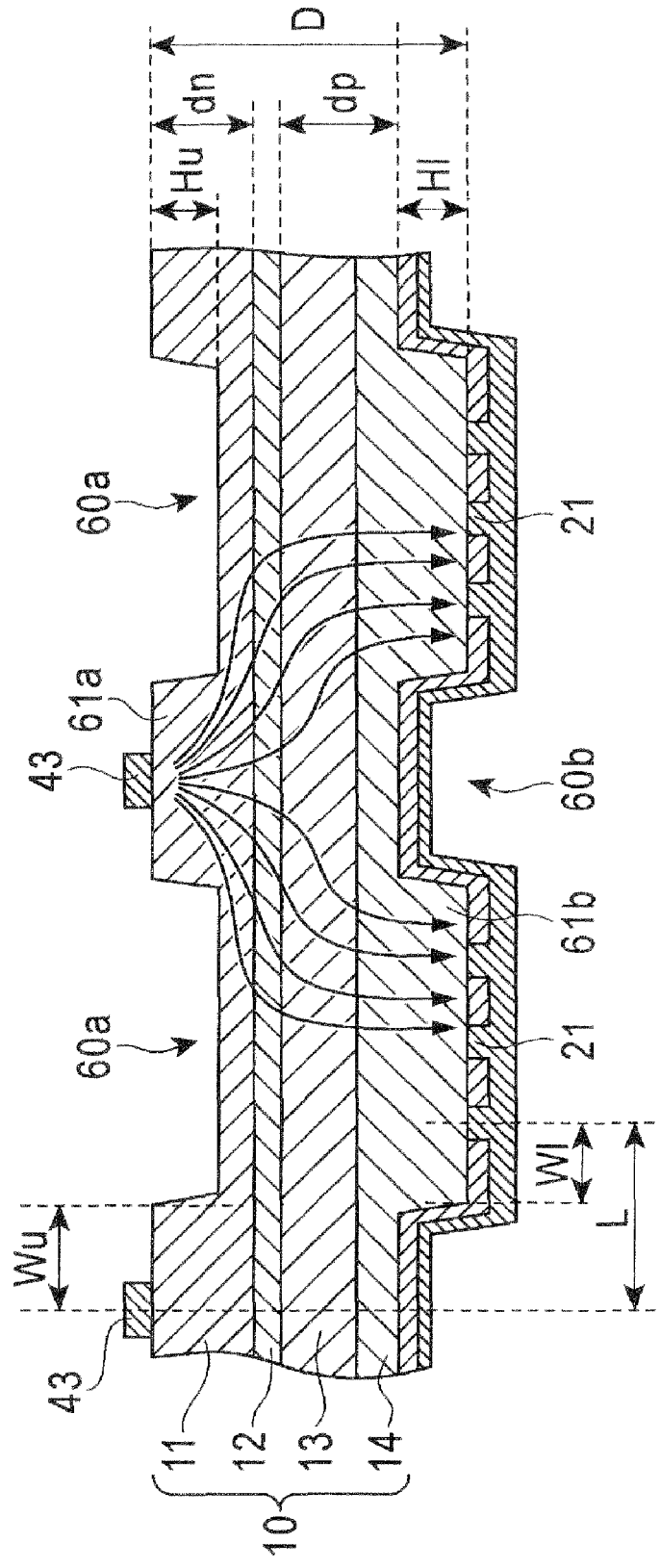
FIG. 5 is a cross-sectional view showing the configuration of the terrace structure that is the embodiment of the present invention.

The light-extraction-surface-side ohmic electrode 43 is formed on the surface of the protrusion 61a on the light-extraction-surface side of the semiconductor film 10. The recess 60a on the light-extraction-surface side is provided in a region containing a region directly above the contact between the reflecting electrode 21 and the semiconductor film 10. The proportion (surface ratio) occupied by the recesses 60a of the surface on the light-extraction-surface side of the semiconductor film 10 is preferably 15% or greater. If the area of the recesses 60a is made too small, the effect of improving the light extraction efficiency will be reduced. On the other hand, if the area of the recesses 60a is made too large, the recesses 60a will cut off the current paths, thereby hindering the current spread. As shown in FIG. 5, the distance Wu from the light-extraction-surface-side ohmic electrode 43 to an edge of the recess 60a is set at 30 to 70%, preferably 40 to 60%, of the horizontal distance L from the ohmic electrode 43 on the light-extraction-surface side to the reflecting electrode 21 on the reflecting-surface side. Note that the horizontal distance refers to a distance measured when the images of the ohmic electrode 43 on the light-extraction-surface side and the reflecting electrode 21 on the reflecting-surface side are projected onto the same plane parallel to the principal surface of the semiconductor film 10. The depth Hu of the recess 60a on the light-extraction-surface side is preferably at 15% or greater of the total thickness D of the semiconductor film 10 and at 25 to 75% of the thickness dn of the n-type clad layer 11. Note that where the semiconductor film 10 includes a layer of n-type conductivity as well as the n-type clad layer 11, the dn refers to the sum of the thicknesses of all the layers of n-type conductivity. Although the region where the recess 60a is formed is a region that does not contribute to the current spread, if the n-type clad layer 11 is removed partially down to such a depth as to reach the light emitting layer 12, at the material-removed region, carriers cannot be injected into the light emitting layer 12, resulting in the occurrence of a non-light emitting region. Hence, the n-type clad layer 11 is preferably not completely removed.
(Configuration of the Terrace Structure on the Reflecting-Surface Side)

The reflecting electrode 21 is formed on the surface of the protrusion 61b on the reflecting-surface side of the semiconductor film 10. The protrusions 61b are bonded to the support substrate 30 via the reflecting film 20. The recess 60b on the reflecting-surface side is formed in a region containing a region directly under the light-extraction-surface-side ohmic electrode 43. The bottom of the recess 60b is separated by a space 70 from the support substrate 30.

The Schottky electrode 41 on the light-extraction-surface side is provided over the protrusion 61b on the reflecting-surface side, and the recess 60b on the reflecting-surface side is formed so as not to be located directly under the Schottky electrode 41. This is because with the Schottky electrode 41 forming a bonding pad, if the recess 60b on the reflecting-surface side existed directly under the bonding pad, the semiconductor film 10 might be damaged by the pressing force of a bonding tool. The proportion (surface ratio) occupied by the recesses 60b of the surface on the reflecting-surface side of the semiconductor film 10 is preferably 15% or greater but not greater than 50%. If the area of the recesses 60b is made too small, the effect of improving the luminous efficiency will be reduced. On the other hand, if the area of the recesses 60b is made too large, the current spread is hindered and also the mechanical strength of the semiconductor film 10 is reduced, resulting in the occurrence of a problem in reliability. As shown in FIG. 5, the distance W1 from the reflecting electrode 21 to an edge of the recess 60b is set at 30 to 70%, preferably 40 to 60%, of the horizontal distance L from the ohmic electrode 43 on the light-extraction-surface side to the reflecting electrode 21 on the reflecting-surface side. The depth H1 of the recess 60b on the reflecting-surface side is preferably at 15% or greater of the total thickness D of the semiconductor film 10 and at 25 to 75% of the total thickness dp of the p-type contact layer 14 and the p-type clad layer 13. Note that where the semiconductor film 10 includes a layer of p-type conductivity as well as the p-type contact layer 14 and the p-type clad layer 13, the dp refers to the sum of the thicknesses of all the layers of p-type conductivity. Although the region where the recess 60b is formed is a region that does not contribute to the current spread, if the p-type contact layer 14 and the p-type clad layer 13 are removed partially down to such a depth as to reach the light emitting layer 12, at the material-removed region, carriers cannot be injected into the light emitting layer 12, resulting in the occurrence of a non-light emitting region. Hence, the p-type clad layer 13 is preferably not completely removed.

Figure 6:
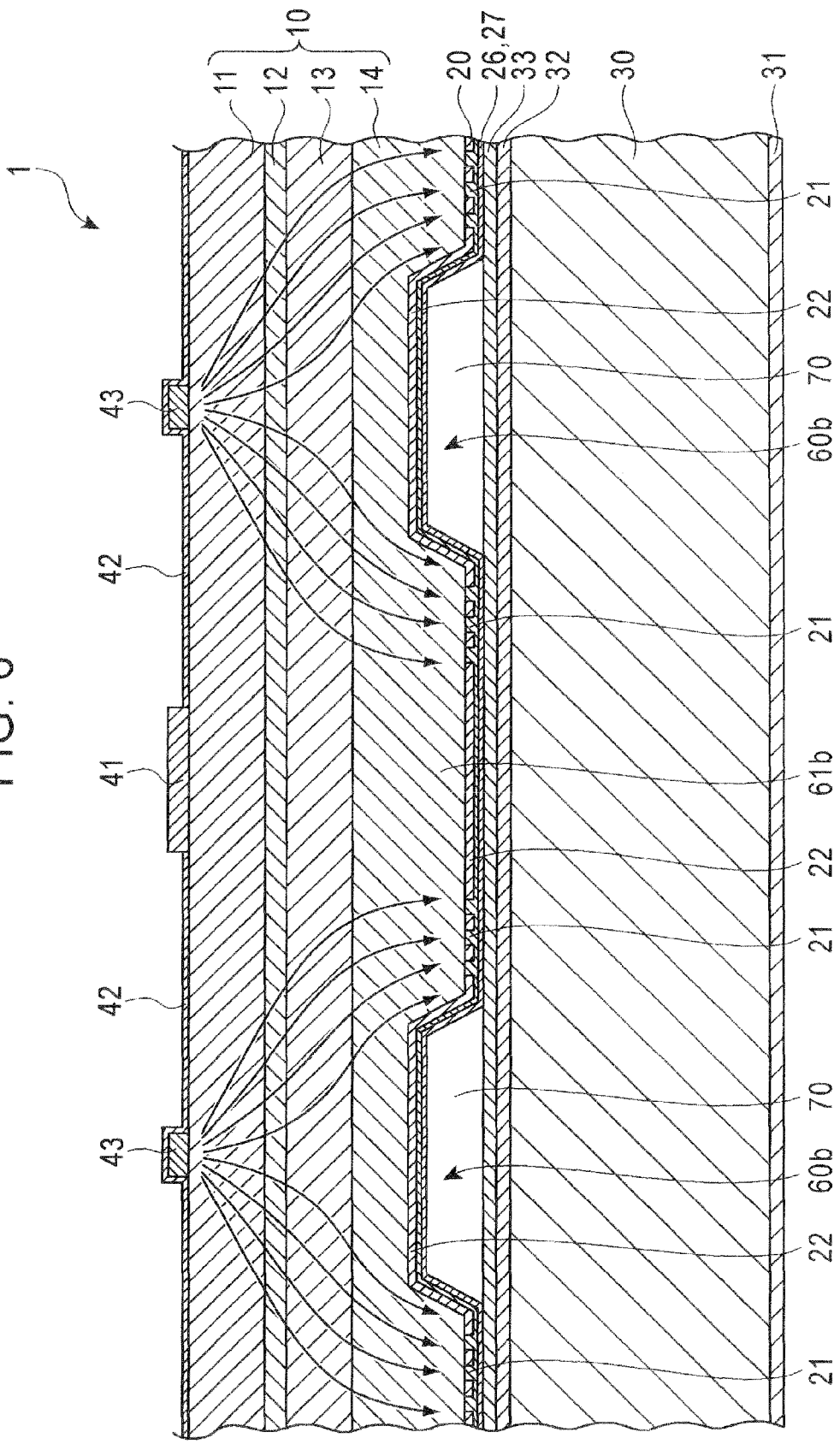
FIG. 6 is a cross-sectional view showing the configuration of a semiconductor light emitting device that is another embodiment of the present invention.

Although the above embodiment is configured such that the outline of the recess 60a on the light-extraction-surface side and the outline of the protrusion 61b on the reflecting-surface side are located one over the other along a direction of the semiconductor film 10 thickness and that the outline of the protrusion 61a on the light-extraction-surface side and the outline of the recess 60b on the reflecting-surface side are located one over the other (the recess 60a is not over the recess 60b and the protrusion 61a is not over the protrusion 61b), the present invention is not limited to this. That is, it does not matter whether or not the recess 60a on the light-extraction-surface side and the recess 60b on the reflecting-surface side are located one over the other along a direction of the semiconductor film 10 thickness and whether or not the protrusion 61a on the light-extraction-surface side and the protrusion 61b on the reflecting-surface side are located one over the other. Further, in the above embodiment, both surfaces on the light-extraction-surface side and on the reflecting-surface side of the semiconductor film 10 are made to have the terrace structure, but the terrace structure needs to be provided at least on the reflecting-surface side. This is because, while recesses can be formed on either side to produce the effect of suppressing the self-absorption, for light which is reflected on the reflecting-surface side and sent out through the light extraction surface out of the light emitted from the light emitting layer, the self-absorption suppressing effect associated with the optical length shortening effect produced by the terrace structure formed on the reflecting-surface side is extremely large. FIG. 6 is a cross-sectional view of the semiconductor light emitting device 1 having the terrace structure only on the reflecting-surface side of the semiconductor film 10. It is possible to suppress the self-absorption of light propagating in the semiconductor film without hindering the current spread by making either surface of the semiconductor film 10 have the terrace structure. Although in the above embodiment the p-side of the semiconductor film 10 is the reflecting surface with the n-side thereof being the light extraction surface, the n-side may be the reflecting surface with the p-side being the light extraction surface.

(Adding a Light Extraction Structure)

Figure 7:
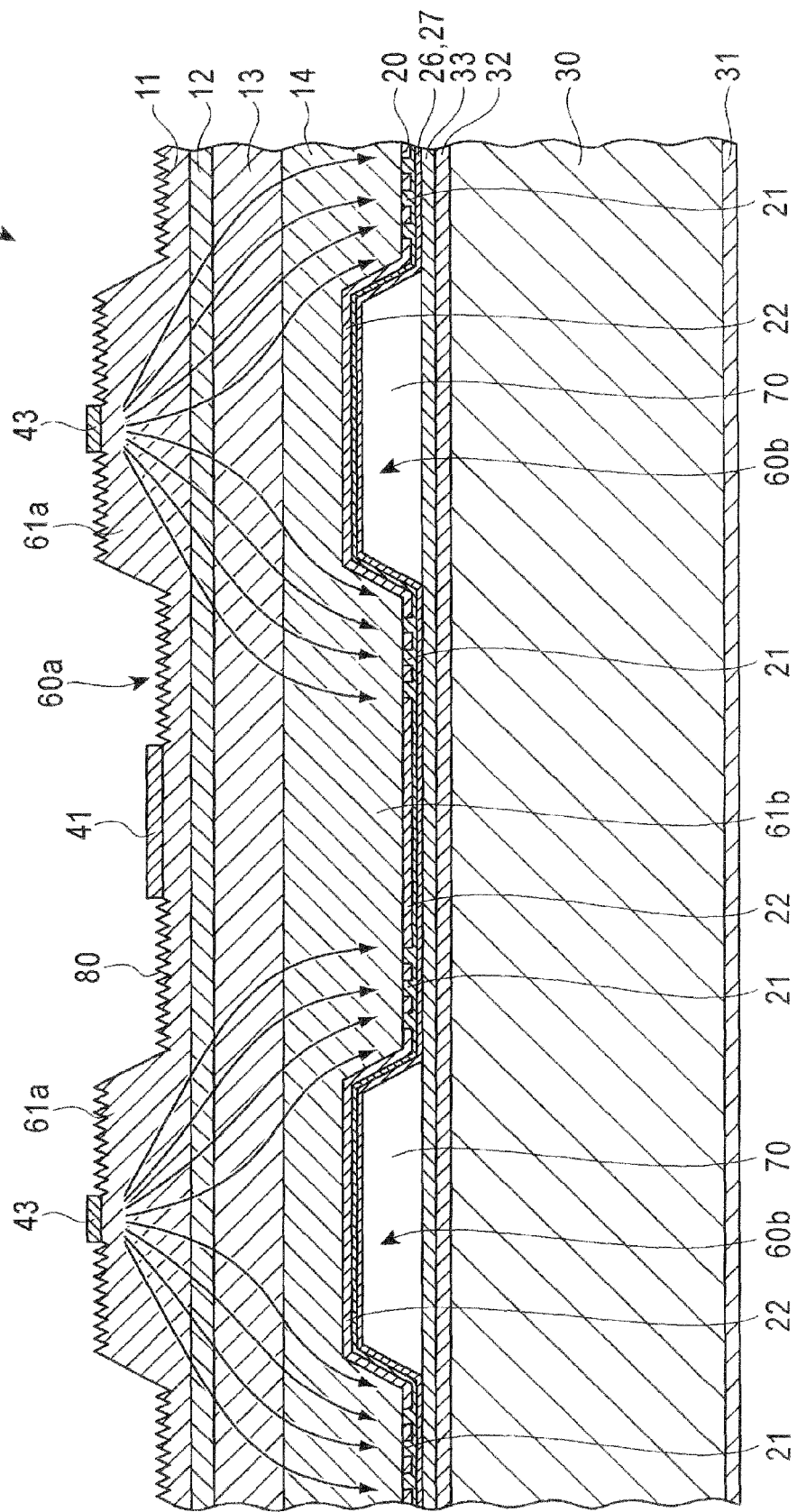
FIG. 7 is a cross-sectional view showing the configuration of a semiconductor light emitting device that is another embodiment of the present invention.

As shown in FIG. 7, in the semiconductor light emitting device 1 according to the present embodiment, the light extraction efficiency can be further improved by adding a light extraction structure 80 to the surface on the light-extraction-surface side of the semiconductor film 10. Specifically, the surface of the semiconductor film is coarsened, or a photonic crystal comprising multiple protrusions or holes is formed in the surface of the semiconductor film. It is possible to suppress the self-absorption of light propagating in the semiconductor film 10 by making the semiconductor film 10 have the terrace structure. However, light multi-reflection itself cannot be effectively prevented only by making the semiconductor film 10 have the terrace structure. By forming fine recesses/protrusions in the light extraction surface of the semiconductor film 10, the amount of light totally reflected at the interface between the semiconductor film 10 and the ambient medium can be reduced. That is, by combining the terrace structure and the light extraction structure, light can be extracted outside with maintaining high light output because of synergistic action of the self-absorption suppressing effect and the multi-reflection suppressing effect. With this configuration, the light extraction efficiency can be further improved as compared with a conventionally-structured semiconductor light emitting device having only the light extraction structure.

Next, a manufacturing method of the semiconductor light emitting device 1 according to the embodiment of the present invention will be described. In the description below, there is shown a manufacturing method of a semiconductor light emitting device which has the terrace structure in opposite surfaces of the semiconductor film and has the light extraction structure in the surface on the light-extraction-surface side.

(Semiconductor Film Forming Process)

Figure 8A:
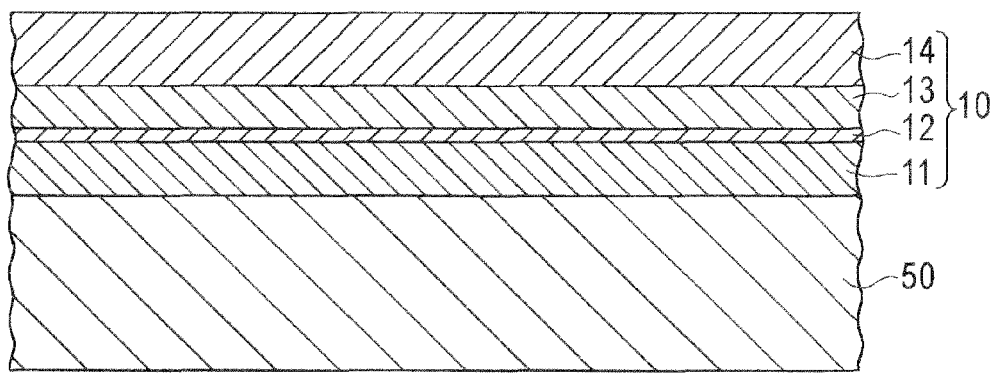
FIGS. 8A to 8C are cross-sectional views showing a manufacturing method of the semiconductor light emitting device that is the embodiment of the present invention.

The semiconductor film 10 was formed by a metal organic chemical vapor deposition method (MOCVD method). An n-type GaAs substrate of 300 μm thickness which slopes at an angle of 15° in the [011] direction relative to the (100) plane was used as a growth substrate 50 for use in the crystal growth of the semiconductor film 10. The n-type clad layer 11 made of $(Al_{0.7}Ga_{0.3})_{0.5}In_{0.5}P$ and 3 μm thick was formed on the growth substrate 50. The light emitting layer 12 was formed on the n-type clad layer 11. The light emitting layer 12 was made to have a multi-quantum well structure where well layers made of $(Al_{0.1}Ga_{0.9})_{0.5}In_{0.5}P$, 20 nm thick and barrier layers made of $(Al_{0.56}Ga_{0.44})_{0.5}In_{0.5}P$, 10 nm thick are alternately laid one over the other 15 times. Note that the proportion of Al of the well layers can be changed in the range of $0 \leq z \leq 0.4$, corresponding to the light emission wavelength. The p-type clad layer 13 made of $(Al_{0.7}Ga_{0.3})_{0.5}In_{0.5}P$ and 1 μm thick was formed on the light emitting layer 12. Note that the proportion z of Al of the n-type clad layer 11 and the p-type clad layer 13 can be changed in the range of $0.4 \leq z \leq 1.0$. The p-type contact layer 14 made of $Ga_{0.90.5}In_{0.4}P$ and 1.5 μm thick was formed on the p-type clad layer 13. The proportion of In of the p-type contact layer 14 can be changed in such a range that the layer does not absorb light from the light emitting layer 12. The semiconductor film 10 of 6 μm thickness is composed of these layers (FIG. 8A).

Note that phosphine ($PH_3$) was used as a Group V material and that organic metals which are trimethylgallium (TMGa), trimethylaluminum (TMAl), and trimethylindium (TMI) were used as Group III materials. Silane ($SiH_4$) was used as material for Si that is an n-type impurity, and dimethylzinc (DMZn) was used as material for Zn that is a p-type impurity. Growth temperature was 750 to 850° C.; hydrogen was used as a carrier gas; and growth pressure was 10 kPa.

(Forming Process of the Terrace Structure on the Reflecting-Surface Side)

Figure 8B:
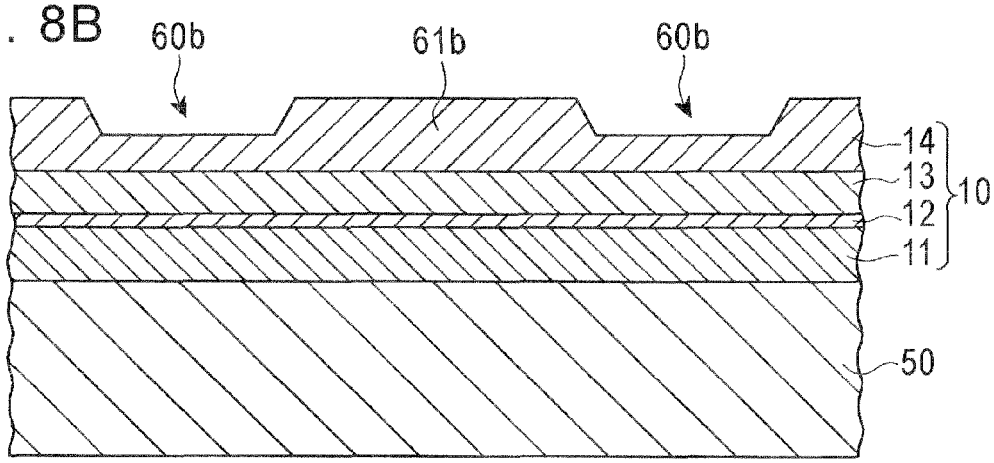

By processing the p-type contact layer 14 on the reflecting-surface side, the terrace structure was formed on the reflecting-surface side of the semiconductor film 10. A mask of $SiO_2$ was formed on the p-type contact layer 14, and parts of the p-type contact layer 14 exposed through openings of the mask were removed by dry etching to form the recesses 60b. The protrusions 61b are formed in association with the formation of the recesses 60b. By controlling the etching time, the depth of the recesses 60b was set at 1.5 μm, which corresponds to 60% of the thickness of the p-type semiconductor layer including the p-type contact layer 14 and the p-type clad layer 13 and 25% of the total thickness of the semiconductor film 10. The proportion (area ratio) occupied by the recesses 60b of the surface on the reflecting-surface side of the semiconductor film 10 was set at 30% (FIG. 8B). The bottom of the recesses 60b may reach the p-type clad layer 13, but the etching should not be deep down to the light emitting layer 12. Instead, wet etching can be used as the etching method.

(Forming Process of the Reflecting Film and Metal Layer)

An $SiO_2$ film constituting the dielectric film 22 was formed by a plasma CVD method on the p-type contact layer 14 to cover the surfaces of the recesses 60b and the protrusions 61b. The thickness t of the $SiO_2$ film is set to satisfy $t = m \cdot \lambda_0 / 4n$, where $\lambda_0$ is the light emission wavelength in a vacuum, n is the refractive index of the $SiO_2$ film, and m is an arbitrary integer. Here, letting $\lambda_0 = 625$ nm, n=1.45, and m=3, then the thickness t of the dielectric film 22 was 320 nm. Subsequently, a resist mask was formed on the $SiO_2$ film, and then etching was perform using buffered hydrofluoric acid (BHF) to perform patterning corresponding to the reflecting electrodes on the $SiO_2$ film. Openings were formed in etched-away regions of the $SiO_2$ film, and through the openings, the p-type contact layer 14 is partially exposed. Note that a thermal CVD method or a sputtering method can also be used as the film forming method of the $SiO_2$ film. Further, a dry etching method can be used as the etching method of the $SiO_2$ film. Instead of $SiO_2$, another transparent dielectric material such as $Si_3N_4$ or $Al_2O_2$ can be used for the dielectric film 22.

Then, the reflecting electrodes 21 made of AuZn and 300 nm thick were formed on the dielectric film 22 by an EB evaporation method. The reflecting electrodes 21 are in contact with the p-type contact layer 14 through the openings formed in the dielectric film 22 by the previous etching. The reflecting electrode 21 is separated by the dielectric film 22 into the line-like line electrode 21a and island-like dot electrodes 21b. The reflecting film 20 is comprised of the dielectric film 22 and the reflecting electrodes 21.

Next, TaN (100 nm), TiW (100 nm), and TaN (100 nm) were sequentially deposited over the reflecting film 20 by a sputtering method to form the barrier metal layer 26. Note that the barrier metal layer 26 may be constituted by a single layer or two or more layers including high melting-point metal such as Ta, Ti, or W, or a nitride thereof. The barrier metal layer 26 may be formed using an EB evaporation method instead of the sputtering method. Then, heat treatment was performed in a nitrogen atmosphere at about 500°

C. Thereby, good ohmic contact was formed between the reflecting electrodes 21 and the p-type contact layer 14.

Figure 8C:
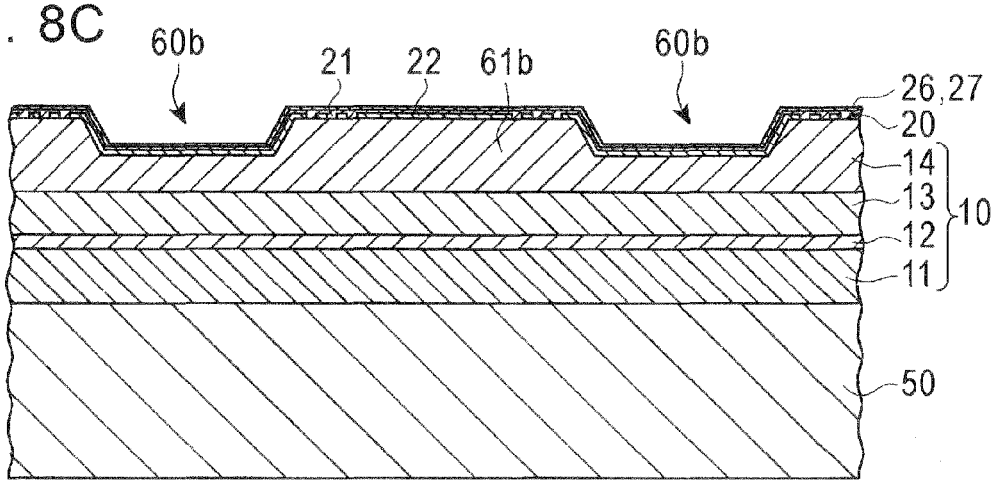

Then, Ni (300 nm) and Au (30 nm) were sequentially formed over the barrier metal layer 26 by an EB evaporation method to form the adhesive layer 27. Note that a resistance heating evaporation method or a sputtering method can be used to form the adhesive layer 27 (FIG. 8C).

(Support Substrate Bonding Process)

A Si substrate given conductivity by doping with a p-type impurity was used as the support substrate 30 for supporting the semiconductor film 10. The ohmic metal layers 31 and 32 made of Pt and 200 nm thick were formed on opposite surfaces of the support substrate 30. Subsequently, Ti (150 nm), Ni (100 nm), and AuSn (600 nm) were sequentially deposited over the ohmic metal layer 32 by a sputtering method to form the junction layer 33. The AuSn layer is used as the eutectic binding material, and its composition desirably consists of 70 to 80 wt % of Au and 20 to 30 wt % of Sn. The Ni layer has a function to improve wettability to the eutectic binding material. Instead of Ni, NiV or Pt can be used. The Ti layer has a function to improve adhesion between the Ni and the ohmic metal layer 32. For the ohmic metal layers 31, 32, another material which can form ohmic contact with the Si substrate such as Au, Ni, or Ti can be used, not being limited to Pt. The support substrate 30 may be made of another material which has conductivity and high thermal conductivity such as Ge, Al, or Cu.

Figure 9A:
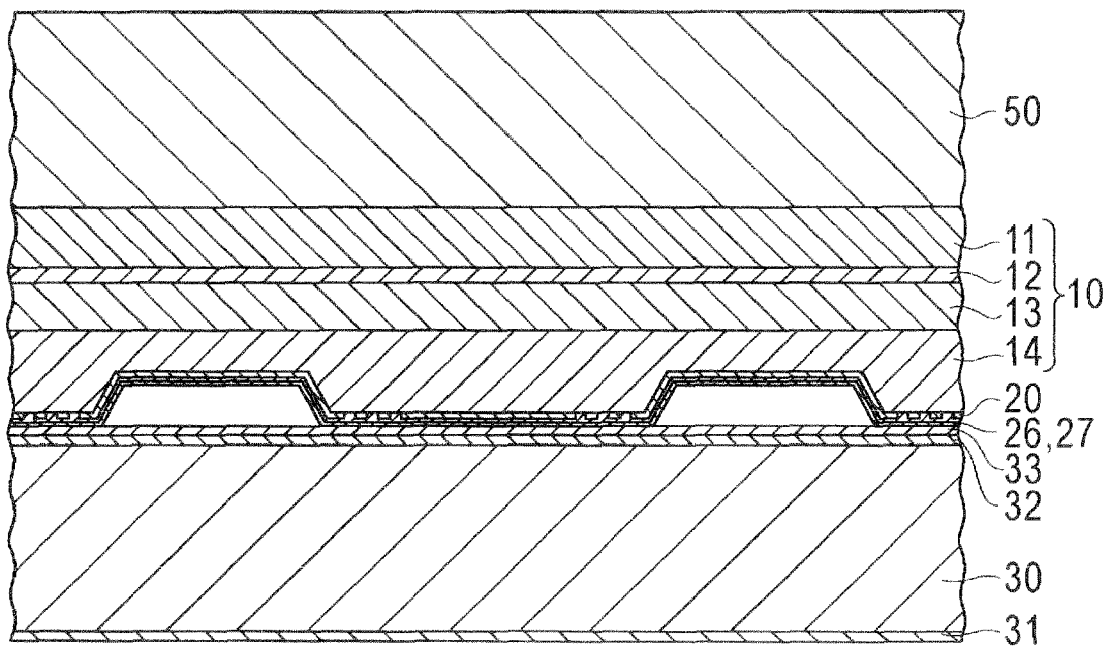
FIGS. 9A and 9B are cross-sectional views showing the manufacturing method of the semiconductor light emitting device that is the embodiment of the present invention.

The semiconductor film 10 and the support substrate 30 were bonded by thermal compression. The adhesive layer 27 on the semiconductor film 10 side and the junction layer 33 on the support substrate 30 side were put in close contact and kept in a nitrogen atmosphere at 1 MPa and 330° C. for 10 minutes. The eutectic binding material (AuSn) included in the junction layer 33 on the support substrate 30 side melts and, together with the adhesive layer 27 (Ni/Au) on the semiconductor film 10 side, forms AuSnNi and thereby the support substrate 30 and the semiconductor film 10 are bonded together (FIG. 9A).

(Growth Substrate Removing Process)

Figure 9B:
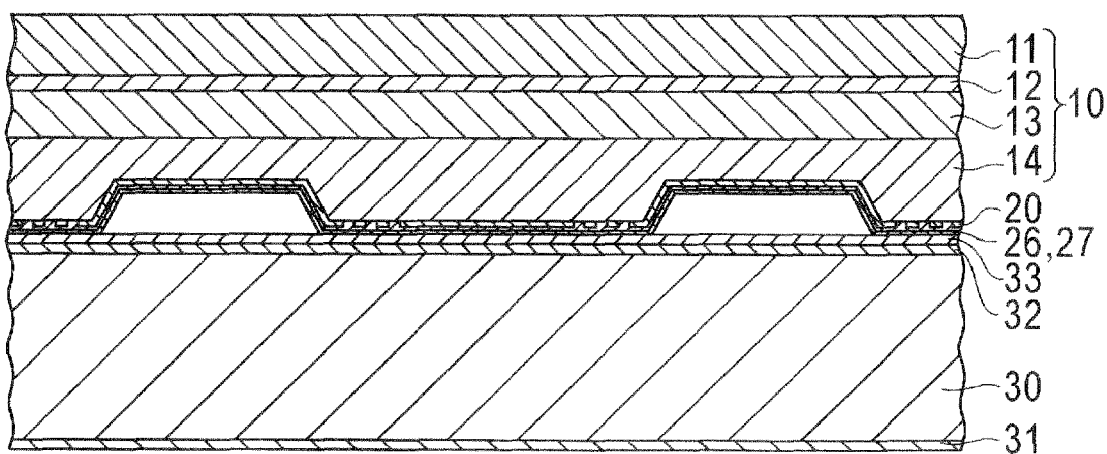

The growth substrate 50 used in the crystal growth of the semiconductor film 10 was removed by wet etching using a mixture of ammonia water and hydrogen peroxide water. Note that a dry etching method, a mechanical polishing method, or a chemical mechanical polishing method (CMP) may be used for removing the growth substrate 50 (FIG. 9B).

(Forming Process of the Terrace Structure on the Light-Extraction-Surface Side)

Figure 10A:
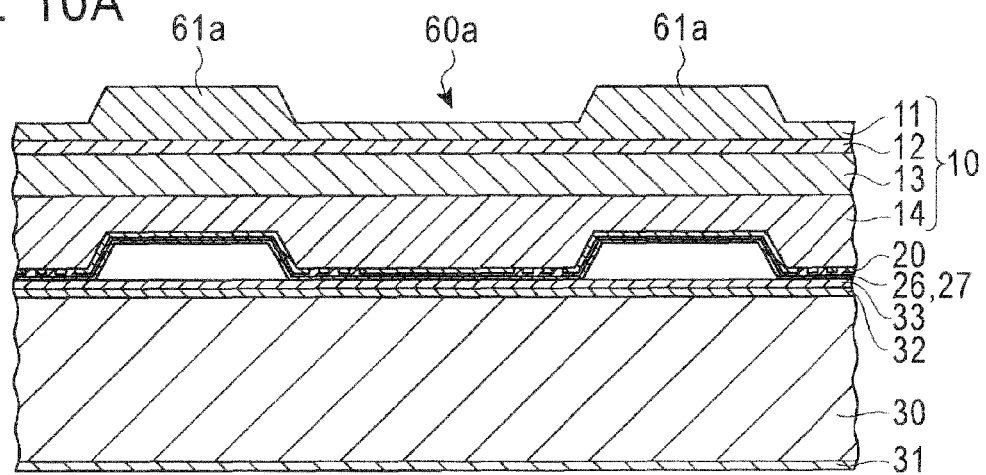
FIGS. 10A to 10C are cross-sectional views showing the manufacturing method of the semiconductor light emitting device that is the embodiment of the present invention.

By processing the n-type clad layer 11 exposed by removing the growth substrate 50, the terrace structure was formed on the light-extraction-surface side of the semiconductor film 10. A mask of $SiO_2$ was formed on the n-type clad layer 11, and parts of the n-type clad layer 11 exposed through openings of the mask were removed by dry etching to form the recesses 60a on the light-extraction-surface side. The protrusions 61a on the light-extraction-surface side are formed in association with the formation of the recesses 60a. By controlling the etching time, the depth of the recesses 60a was set at 1.5 μm, which corresponds to 50% of the thickness of the n-type clad layer 11 and 25% of the total thickness of the semiconductor film 10. The proportion (area ratio) occupied by the recesses 60a of the surface on the light-extraction-surface side of the semiconductor film 10 was set at 70% (FIG. 10A). Instead, wet etching can be used as the etching method.

(Light Extraction Structure Forming Process)

Figure 10B:
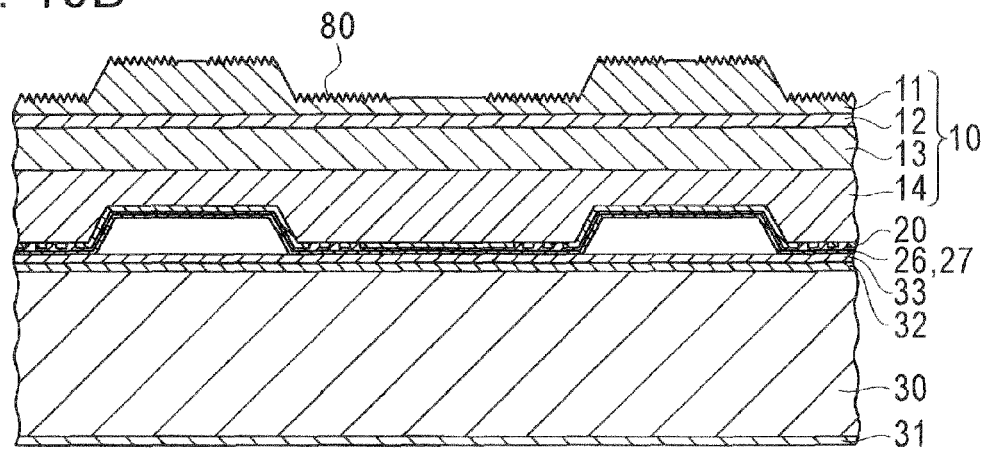

By finely processing the surface of the n-type clad layer 11, the photonic crystal 80 was formed to improve the light extraction efficiency. A mask for an artificial periodic structure was formed on the n-type clad layer 11 by photolithography and a lift-off method, and then multiple conic projections, in a triangle lattice array, of a period of 500 nm, a height of 600 nm, and an aspect ratio of 1.2 were formed in the surface of the n-type clad layer 11 (FIG. 10B). Instead, a fine processing technology such as EB lithography or nano-imprint can be used in forming the mask pattern. Not being limited to conic projections, the photonic crystal may be in the form of cylindrical projections or pyramid projections, or may comprise multiple holes or grooves. Further, by coarsening the surface of the n-type clad layer 11 by wet etching, the light extraction structure may be formed. The above processing may be performed after a mask is provided on the electrode-to-be-formed regions on the light-extraction-surface side as needed. The light extraction structure may be provided on the sloping surfaces of the protrusions 61a.

(Forming Process of the Electrodes on the Light-Extraction-Surface Side)

Figure 10C:
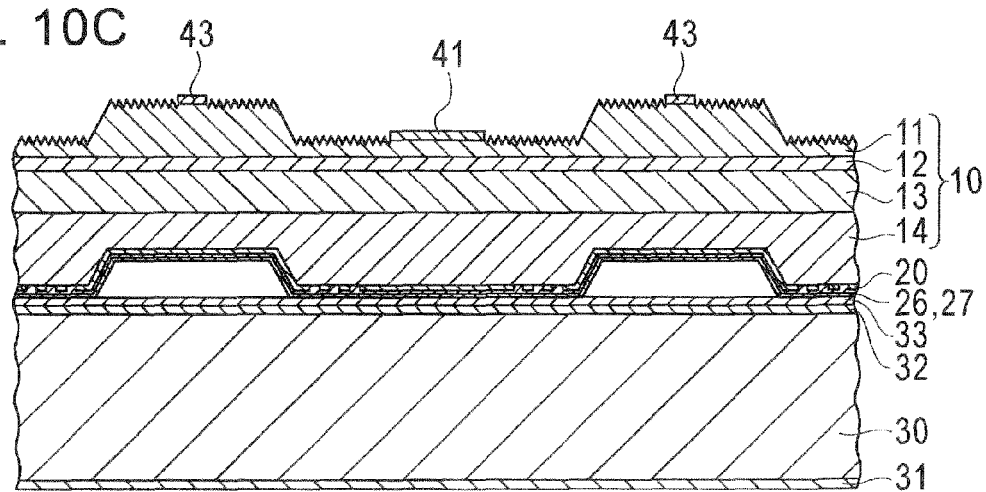

The ohmic electrodes 43, Schottky electrode 41, and connection lines 42 were formed on the n-type clad layer 11. After AuGeNi was deposited by an EB evaporation method over the n-type clad layer 11 to form ohmic contact with the n-type clad layer 11, patterning was performed by a lift-off method to form the ohmic electrodes 43. Subsequently, Ti (100 nm) was deposited by an EB evaporation method over the n-type clad layer 11 to form Schottky contact with the n-type clad layer 11, and further Au (1.5 μm) was deposited over the Ti. Then, patterning was performed by a lift-off method to form the Schottky electrode 41 and connection lines 42. Note that AuGe, AuSn, AuSnNi, or the like can also be used for the ohmic electrodes 43. Further, Ta, W, or an alloy thereof, or a nitride thereof can also be used for the Schottky electrode 41. Then, heat treatment was performed in a nitrogen atmosphere at 400° C. to promote the formation of ohmic contact between the n-type clad layer 11 and the ohmic electrodes 43 (FIG. 10C). By undergoing the above processes, the semiconductor light emitting device 1 is finished.

Figure 11A:
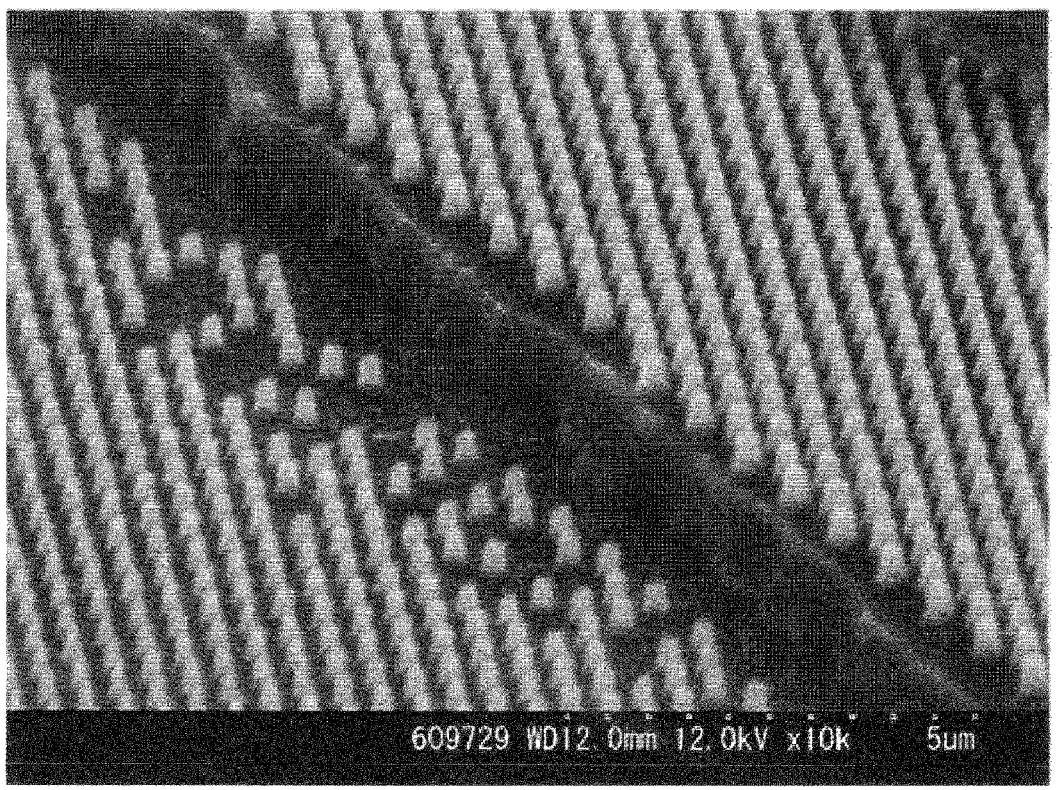
FIGS. 11A and 11B are SEM micrographs of the semiconductor light emitting device that is the embodiment of the present invention.
Figure 11B:
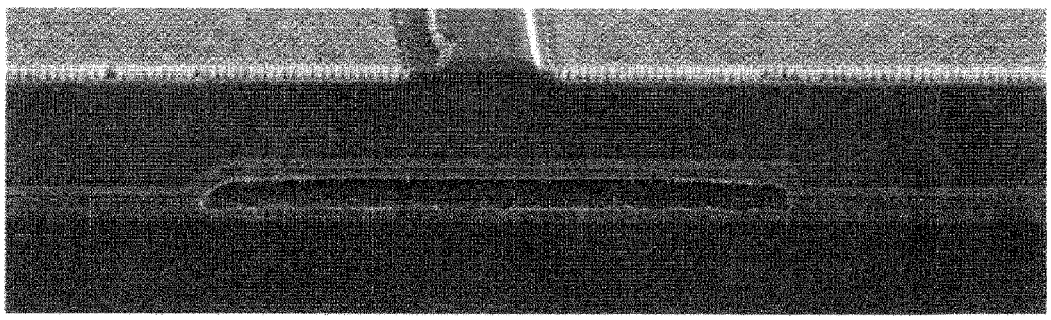

FIGS. 11A and 11B are SEM micrographs of the semiconductor light emitting device produced through the above production process; FIG. 11A shows an image of the light extraction surface of the semiconductor film 10 in which the photonic crystal is formed; and FIG. 11B shows an image of a cross-section of the semiconductor light emitting device.

(Evaluation Results)

Figure 12:
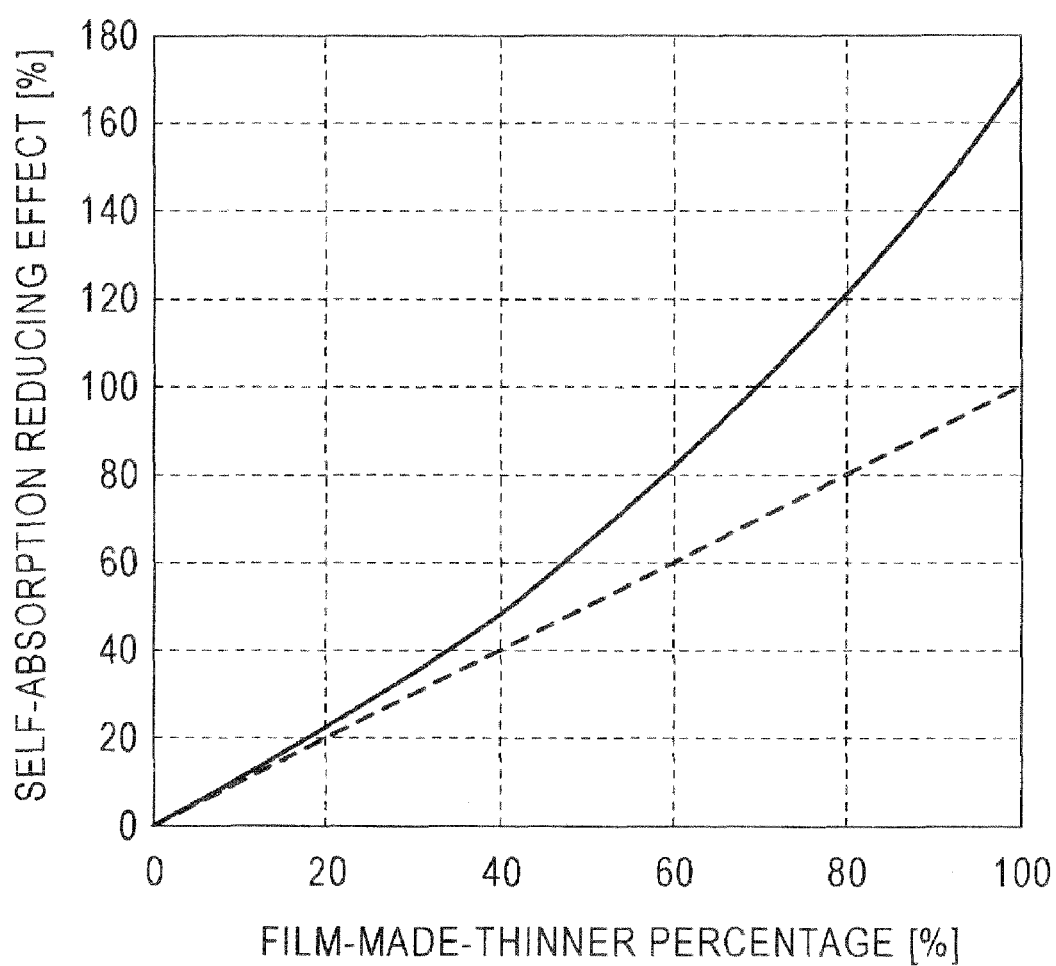
FIG. 12 is a graph showing a relationship between the percentage by which a semiconductor film is made thinner and self-absorption reducing effect.

First, the light self-absorption suppressing effect when the semiconductor film is made thinner was examined. FIG. 12 shows the results of estimating the effect. In FIG. 12, the horizontal axis represents the percentage by which the semiconductor film 10 was made thinner, and the vertical axis represents the self-absorption suppressing effect for light propagating in the semiconductor film. The self-absorbed light amount increases exponentially with the propagation distance (optical path length) of light in the semiconductor film. Hence, the light output increases at a greater rate than the thickness of the semiconductor film changes. For example, it is expected that reducing the thickness of the semiconductor film by 50% will result in a reduction of about 65% in light self-absorption.

Figure 13:
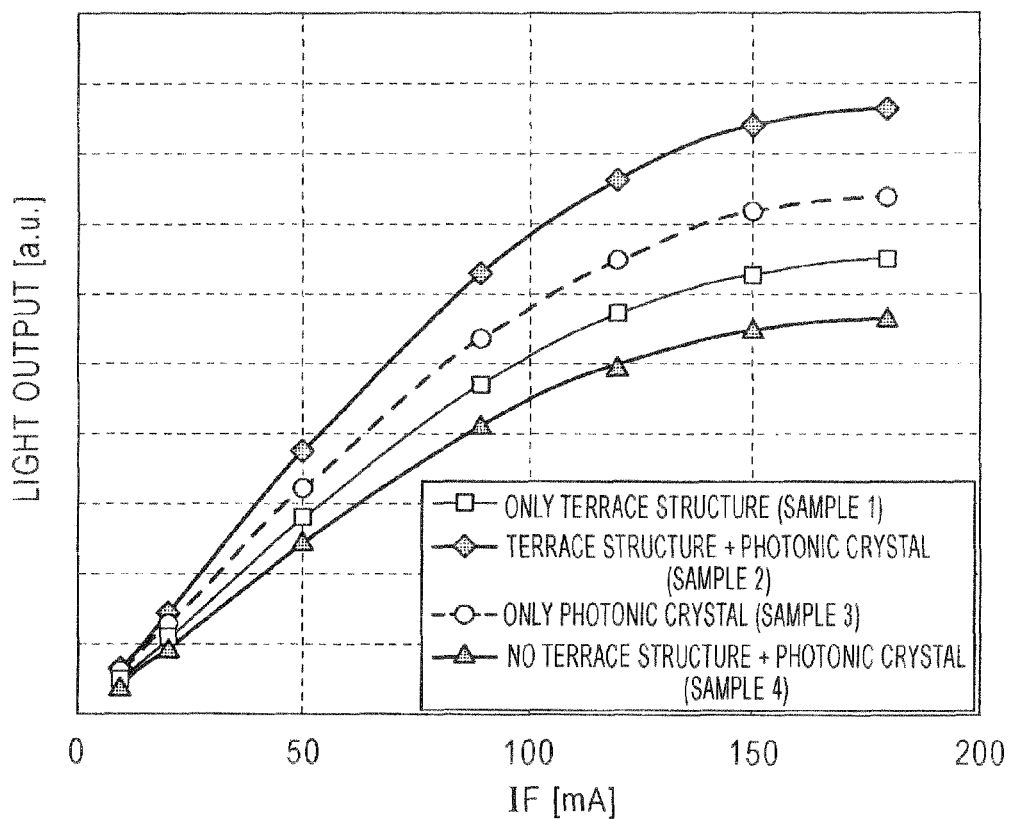
FIG. 13 is a graph showing current vs. light output characteristics of the semiconductor light emitting devices according to the embodiments of the present invention.

Next, a current vs. light output characteristic of the semiconductor light emitting device 1 according to the embodiment of the present invention was obtained. Assessed samples were of the following four types: one with opposite surfaces of the semiconductor film having the terrace structure (sample 1), one with opposite surfaces of the semiconductor film having the terrace structure and further the photonic crystal formed in the light extraction surface (sample 2), one as a comparative example without the terrace structure in the semiconductor film and with the photonic crystal formed (sample 3), and one as another comparative example with neither the terrace structure nor the photonic crystal formed (sample 4). FIG. 13 is a graph showing current vs. light output characteristics of the assessed samples 1 to 4. Taking the one with neither the terrace structure nor the photonic crystal formed (sample 4) as a reference, the light output at 90 mA was improved by 14% for the one with opposite surfaces of the semiconductor film having the terrace structure (sample 1). For the one without the terrace structure formed and with the photonic crystal formed (sample 3), the light output at 90 mA was improved by 29%. For the one with opposite surfaces of the semiconductor film having the terrace structure formed and further the photonic crystal formed on the light extraction surface (sample 2), the light output at 90 mA was improved by 52%. When comparing the samples 1 and 4, and the samples 2 and 3, in either case, the light output of the one with the semiconductor film having the terrace structure was improved. From the above results, it was confirmed that by making the semiconductor film have the terrace structure, the light extraction efficiency can be improved.

Figure 14:
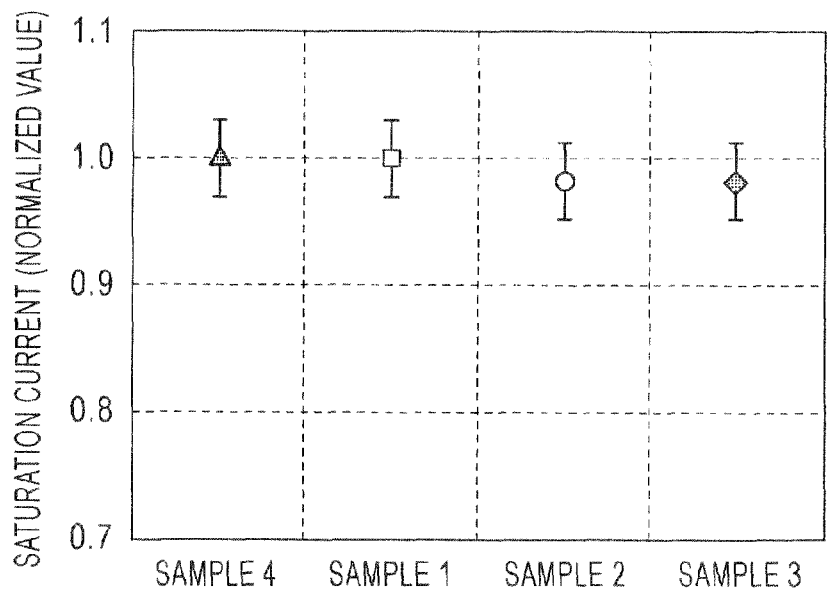
FIG. 14 shows saturation currents of the semiconductor light emitting devices according to the embodiments of the present invention.

Then, in order to confirm whether the current spread was hindered by making the semiconductor film have the terrace structure, the current value when the light output is saturated (called a saturation current value) was measured for each of the above samples 1 to 4. That is, if the current spread is hindered, current constriction occurs, making the density of carriers injected into the light emitting layer become higher while the current value is the same, resulting in a decrease in the saturation current. FIG. 14 shows results of measuring the saturation current of the above samples 1 to 4, and the vertical axis indicates values normalized to the saturation current value of the one with neither the terrace structure nor the photonic crystal formed in the semiconductor film (sample 4). There is seen a difference in saturation current value between the ones with the photonic crystal formed (samples 2, 3) and the ones without the photonic crystal (samples 1, 4), whereas there is not seen a difference in saturation current value between the ones with the terrace structure formed (samples 1, 2) and the ones without the terrace structure (samples 3, 4). This means that if the terrace structure is formed in such a way as not to cut off the current paths, the current spread is not hindered and that thus the luminous efficiency can be maintained.

Next, the light outputs of the ones with the semiconductor film having the terrace structure and of the ones without having the terrace structure were compared. The light output was improved by 13% for the one without the photonic crystal formed and with the semiconductor film having the terrace structure. Meanwhile, for the one with the photonic crystal formed and with the semiconductor film having the terrace structure, the light output was improved by 18%. That is, when the light extraction structure and the terrace structure are combined, the effect of improving the light extraction efficiency becomes more conspicuous. This is because of synergistic action of the multi-reflection suppressing effect of the light extraction structure and the self-absorption suppressing effect of the terrace structure.

As apparent from above description, according to the semiconductor light emitting device of the present invention, parts of the semiconductor film that do not contribute to the current spread are removed, thereby making the semiconductor film partially thinner. Hence, the propagation distance (optical path length) of light multi-reflected inside the semiconductor film can be shortened without hindering the current spread. By this means, without current constriction occurring, the self-absorption of light can be suppressed, thus improving the light extraction efficiency.

This application is based on Japanese Patent Application No. 2010-033940 which is herein incorporated by reference.

What is claimed is:

1. A semiconductor light emitting device which comprises a support substrate; a semiconductor film including a light emitting layer provided on said support substrate; surface electrodes provided on a surface on the light-extraction-surface side of said semiconductor film; and a reflecting film forming a reflecting surface and provided between said support substrate and said semiconductor film, wherein said reflecting film includes reflecting electrodes that are in ohmic contact with said semiconductor film and that form current paths between the reflecting electrodes and said surface electrodes in said semiconductor film, wherein said reflecting electrodes are in contact with said semiconductor film at such positions that said surface electrodes are not over the reflecting electrodes along a direction of the thickness of said semiconductor film, wherein said semiconductor film has, at least at the surface on the side facing said reflecting surface, reflecting-surface-side recesses made in regions containing regions directly under said surface electrodes and recessed toward said light-extraction-surface side, and reflecting-surface-side protrusions provided in regions containing parts of said semiconductor film in contact with said reflecting electrodes and bonded to said support substrate via said reflecting film, and wherein said reflecting film covers surfaces of said reflecting-surface-side recesses and said reflecting-surface-side protrusions.

2. A semiconductor light emitting device according to claim 1, wherein said reflecting-surface-side recesses do not cross said current paths.

3. A semiconductor light emitting device according to claim 1, wherein said semiconductor film includes a p-type semiconductor layer and an n-type semiconductor layer between which said light emitting layer is sandwiched, wherein said reflecting-surface-side recesses are formed by partially removing said p-type semiconductor layer or said n-type semiconductor layer, and wherein the depth of said reflecting-surface-side recesses is at 25% or greater but not greater than 75% of the thickness of the p-type semiconductor layer or the n-type semiconductor layer in which said reflecting-surface-side recesses are formed and at 15% or greater of the total thickness of said semiconductor film.

4. A semiconductor light emitting device according to claim 1, wherein of the surface on said reflecting-surface side of said semiconductor film, the proportion occupied by regions where said reflecting-surface-side recesses are formed is 15% or greater but not greater than 50%.

5. A semiconductor light emitting device according to claim 1, wherein said surface electrodes include ohmic electrodes that form ohmic contact with said semiconductor film, and wherein said semiconductor film further has light-extraction-surface-side recesses made in other regions than parts, in contact with said ohmic electrodes, of the surface on said light-extraction-surface side thereof and recessed toward said reflecting-surface side.

6. A semiconductor light emitting device according to claim 5, wherein said light-extraction-surface-side recesses do not cross said current paths.

7. A semiconductor light emitting device according to claim 5, wherein said semiconductor film includes a p-type semiconductor layer and an n-type semiconductor layer between which said light emitting layer is sandwiched,
   wherein said light-extraction-surface-side recesses are formed by partially removing said p-type semiconductor layer or said n-type semiconductor layer, and
   wherein the depth of said light-extraction-surface-side recesses is at 25% or greater but not greater than 75% of the thickness of the p-type semiconductor layer or the n-type semiconductor layer in which said light-extraction-surface-side recesses are formed and at 15% or greater of the total thickness of said semiconductor film.

8. A semiconductor light emitting device according to any of claim 5, wherein said light-extraction-surface-side recesses are provided in regions containing regions directly above contacts between said reflecting electrodes and said semiconductor film.

9. A semiconductor light emitting device according to claim 5, wherein of the surface on said light-extraction-surface side of said semiconductor film, the proportion occupied by regions where said light-extraction-surface-side recesses are formed is 15% or greater.

10. A semiconductor light emitting device according to any of claim 5, wherein said surface electrodes further include a Schottky electrode that forms Schottky contact with said semiconductor film, and
    wherein said Schottky electrode is provided over one of said reflecting-surface-side protrusions.

11. A semiconductor light emitting device according to any of claim 5, wherein the outlines of said light-extraction-surface-side recesses are over the outlines of said reflecting-surface-side protrusions respectively along a direction of the thickness of said semiconductor film.

12. A semiconductor light emitting device according to claim 1, wherein said semiconductor film further has multiple projections or holes or grooves in its surface on said light-extraction-surface side to extract light emitted from said light emitting layer outside.

13. A semiconductor light emitting device according to claim 5, wherein said semiconductor film further has multiple projections or holes or grooves in its surface on said light-extraction-surface side to extract light emitted from said light emitting layer outside.

* * * * *